United States Patent
Lee et al.

(10) Patent No.: US 11,293,958 B2
(45) Date of Patent: Apr. 5, 2022

(54) POWER MEASUREMENT AND ANALYSIS SYSTEM OF MOBILE DEVICE AND METHOD THEREOF

(71) Applicant: AJOU UNIVERSITY INDUSTRY-ACADEMIC COOPERATION FOUNDATION, Suwon-si (KR)

(72) Inventors: Jung Won Lee, Seoul (KR); Du San Baek, Incheon (KR); Yoo Rim Choi, Yeoju-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 336 days.

(21) Appl. No.: 16/375,200

(22) Filed: Apr. 4, 2019

(65) Prior Publication Data

US 2019/0310291 A1 Oct. 10, 2019

(30) Foreign Application Priority Data

Apr. 10, 2018 (KR) .................. 10-2018-0041571

(51) Int. Cl.
*G01R 21/133* (2006.01)
*G06N 20/00* (2019.01)
(52) U.S. Cl.
CPC ........... *G01R 21/133* (2013.01); *G06N 20/00* (2019.01)
(58) Field of Classification Search
CPC .... G01R 21/133; G01R 31/367; G06N 20/00; G06N 3/08; G06N 3/0445; G06F 1/3234;
(Continued)

(56) References Cited

U.S. PATENT DOCUMENTS

2018/0081417 A1* 3/2018 Chan ................. G06F 1/329
2018/0232113 A1* 8/2018 Ham .................. G06F 3/0482

FOREIGN PATENT DOCUMENTS

JP       2012063917 A    3/2012
KR    1020160107692 A    9/2016

OTHER PUBLICATIONS

Communication dated May 20, 2019, issued by the Korean Intellectual Property Office in Korean Application No. 10-2018-0041571.

* cited by examiner

*Primary Examiner* — Michael P Nghiem
*Assistant Examiner* — Dacthang P Ngo
(74) *Attorney, Agent, or Firm* — Sughrue Mion, PLLC (57) ABSTRACT

The power measurement and analysis system of a mobile device includes: a mobile device collecting operation information of components operating in accordance with execution of an application; a measurement and analysis device supplying power to the mobile device and measuring the entire power consumption amount of the mobile device; and a learning server receiving the operation information of the components from the mobile device and the entire power consumption amount from the measurement and analysis device, learning a component state estimation model using the operation information of the components and the entire power consumption amount, and providing the learned component state estimation model to the measurement and analysis device. The measurement and analysis device estimates component states by inputting the entire power consumption amount of the mobile device to the component state estimation model, and calculates power consumption of each of the components in real time.

4 Claims, 6 Drawing Sheets (58) Field of Classification Search
CPC .. G06F 1/3206; G06F 1/3203; G06F 11/3062; G06F 11/324; G01F 1/28; Y02D 10/00
See application file for complete search history.

POWER MEASUREMENT AND ANALYSIS SYSTEM OF MOBILE DEVICE AND METHOD THEREOF

CROSS-REFERENCE TO RELATED APPLICATIONS

This application claims the priority of Korean Patent Application No. 10-2018-0041571 filed on Apr. 10, 2018, in the Korean Intellectual Property Office, the disclosure of which is incorporated herein by reference.

BACKGROUND

Field

The present invention relates to a power measurement and analysis system of a mobile device and a method thereof, particularly, the system and method measuring in real time the entire power consumption by a mobile device and providing in real time the state and the power consumption amount of each component on the basis of the entire power consumption.

Description of the Related Art

Mobile devices have limited power such as a battery. Power is directly linked with the usage time of mobile devices, so it is addressed as a very important matter in mobile platforms. Power is more highlighted in mobile sensing applications that continuously obtain situation information using sensors. Accordingly, it is required to optimize power in the process of developing mobile sensing applications, and for this purpose, it is fundamentally required to clearly know the power consumption amounts of mobile devices.

The methods of obtaining the power consumption amounts of mobile devices are classified in broad meaning into a method of actually measuring the power amount that is consumed by a battery and a method of estimating power on the basis of a model.

First, according to the method of actually measuring the power amount that is consumed by a battery, it is possible to know the power consumption amount by measuring the entire power that is consumed by a mobile device, but it is impossible to know the power amount that is consumed by each of the components of the mobile device and it is difficult to find out the reason of low power efficiency of applications only from the entire power consumption of the mobile device. As a method for compensating for these problems, there is a model-based power estimation. This is a method of finding out the power consumption amount of each of components using operation information of the components and this method collects operation information of components by adding a component operation collection module by using a system service provided by an operating system of a mobile device or changing the operating system and adding a driver, etc., and then estimates (analyzes) the power consumption amounts of the components on the basis of the operation information. An additional calculation is generated to find out the power consumption and the states of components in real time through this method, so a probe effect exists.

However, the probe effect of the collection activity about the power information based on a model has a problem of increasing the power consumption of a mobile device and interfering with operation of the mobile device. In detail, the collection activity about the power information based on a model itself consumes power, so not only the power consumption of a mobile device is increased, but it is difficult to separate the power that is consumed by a module to be measured (device, App, component, etc.) and the power that is consumed by a module that collects information about the power consumption of the module. Further, there is a problem that a mobile device, which is supposed to operate in a power-saving mode if there is no collection activity about the power information, is operated in a very different way due to the collection activity about the power information, so it is impossible to observe the inherent operation of the mobile device.

Accordingly, it is required to develop a technology that can find out the operation states and power consumption amounts of components without a probe effect for finding out the operation information of the components in real time.

In relation to this technology, there is Korean Patent No. 10-0994828 (Title of invention: Power Saving System, Publication Date: Nov. 17, 2011).

SUMMARY

An object of the present invention is to provide a power measurement and analysis system and method of a mobile device, the system and method being able to find out in real time the states and power consumption information of the components of a mobile device without a probe effect.

The objects of the present invention are not limited to that described above and other objects not stated herein may be clearly understood by those skilled in the art from the following description.

In order to achieve the objects of the present invention, a power measurement and analysis system of a mobile device according to an embodiment of the present invention includes: a mobile device collecting operation information of components operating in accordance with execution of an application; a measurement and analysis device supplying power to the mobile device and measuring the entire power consumption amount of the mobile device by measuring the power amount that is supplied; and a learning server receiving the operation information of the components from the mobile device and the entire power consumption amount from the measurement and analysis device, learning a component state estimation model using the operation information of the components and the entire power consumption amount, and providing the learned component state estimation model to the measurement and analysis device, in which the measurement and analysis device may estimate component states by inputting the entire power consumption amount of the mobile device to the component state estimation model, and may calculate power consumption of each of the components in real time through the estimated component states.

Preferably, the measurement and analysis device may include: a power supply unit supplying power to the mobile device; a power measurement unit measuring the entire power consumption amount of the mobile device by measuring the power amount supplied from the power supply unit; and a component operation analysis unit estimating states of the components using machine learning having the entire power consumption amount of the mobile device as input to the component state estimation model, and estimating power consumption of the component in real time through the estimated states of the component.

Preferably, the measurement and analysis device may further include a display unit displaying the entire power consumption amount of the mobile device measured by the power measurement unit, and state information and power consumption of each of the components that are the analysis result by the component operation analysis unit.

Preferably, the measurement and analysis device may further include a near-field communication unit performing wireless communication with the mobile device.

Preferably, the power measurement unit may synchronize time with the mobile device, measure power consumption of the mobile device after measurement is started, and record the measured power consumption with synchronized measurement time, and the component operation analysis unit may estimate states of the components according to the measurement time and estimate in real time power consumption of corresponding components according to the component states using a power model showing a power consumption amount of each of the components.

Preferably, the learning server may include: a learning data management unit creating learning data using the operation information of the components collected from the mobile device and the power consumption amounts collected from the measurement and analysis device; and a component state estimation model learning unit learning a component state estimation model using the operation information of the components and the entire power consumption.

Preferably, the learning data management unit may create learning data composed of input data and output data by matching component operations and power consumption at the same time.

Preferably, the input data may include information for analyzing the states of the components and the power consumption of each of the components through the entire power consumption and corresponding power of the mobile device within a predetermined time, and the output data may be the states of the components.

Preferably, the component state estimation model learning unit may estimate state information of the components through the component state estimation model, estimate power consumption of corresponding components according to the estimated component state information using a power model showing the power consumption amounts of the components, compare the difference between the entire power consumption of the mobile device, which is the sum of the estimated power consumption of the components, and the actually measured entire power consumption of the mobile device with a predetermined critical value, finish learning the component state estimation model when the difference is smaller than the critical value, and learn the component state estimation model by repeating the same process using new learning data when the difference is not smaller than the critical value.

In order to achieve the objects of the present invention, a power measurement and analysis method of a mobile device according to another embodiment of the present invention includes: collecting operation information of components operating in accordance with execution of an application, by means of a mobile device; measuring the entire power consumption amount of the mobile device by measuring a power amount that is supplied to the mobile device, by means of a measurement and analysis device; receiving the operation information of the components from the mobile device and the entire power consumption amount from the measurement and analysis device, learning a component state estimation model using the operation information of the components and the entire power consumption amount, and providing the learned component state estimation model to the measurement and analysis device, by means of a learning server; and estimating component states by inputting the entire power consumption amount of the mobile device to the component state estimation model, and calculating power consumption of each of the components in real time through the estimated component states, by means of the measurement and analysis device.

According to the present invention, by measuring in real time the entire power that is consumed by a mobile device, finding out the states and power consumption amount of each of components from the entire power consumption, and then visualizing and providing the states and power consumption amount of each of components to a user, it is possible to see in real time the state and power consumption information of the components constituting the mobile device without a probe effect.

Further, according to the present invention, it is possible to recognize components that excessively consume power in a mobile device and consequently, it is possible to execute applications with low power. As applications are executed with low power, the usage time of a mobile device is increased, and a user of the mobile device can be provided with more services with higher quality.

The effects of the present invention are not limited to those described above and other effects may be made apparent to those skilled in the art from claims.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

The present invention may be modified in various ways and implemented by various exemplary embodiments, so that specific exemplary embodiments are shown in the drawings and will be described in detail herein. However, it is to be understood that the present invention is not limited to the specific exemplary embodiments, but includes all modifications, equivalents, and substitutions included in the spirit and the scope of the present invention. Reference numerals are assigned to reference components in the following description of drawings.

Terms used in the specification, 'first', 'second', 'A', 'B', etc., may be used to describe various components, but the components are not to be construed as being limited to the terms. The terms are used to distinguish one component from another component. For example, the 'first' component may be named the 'second' component, and vice versa, without departing from the scope of the present invention. The term 'and/or' includes a combination of a plurality of items or any one of a plurality of terms.

It is to be understood that when one element is referred to as being "connected to" or "coupled to" another element, it may be connected directly to or coupled directly to another element or be connected to or coupled to another element, having the other element intervening therebetween. On the other hand, it is to be understood that when one element is referred to as being "connected directly to" or "coupled directly to" another element, it may be connected to or coupled to another element without the other element intervening therebetween.

Terms used in the present specification are used only in order to describe specific exemplary embodiments rather than limiting the present invention. Singular forms are intended to include plural forms unless the context clearly indicates otherwise. It will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

Unless indicated otherwise, it is to be understood that all the terms used in the specification including technical and scientific terms have the same meaning as those that are understood by those who skilled in the art. It will be further understood that terms defined in dictionaries should be interpreted as having a meaning that is consistent with their meaning in the context of this specification and the relevant art and will not be interpreted in an idealized or overly formal sense unless expressly defined herein.

Hereinafter, preferred embodiments of the present invention will be described in detail with reference to the accompanying drawings.

Figure 1:
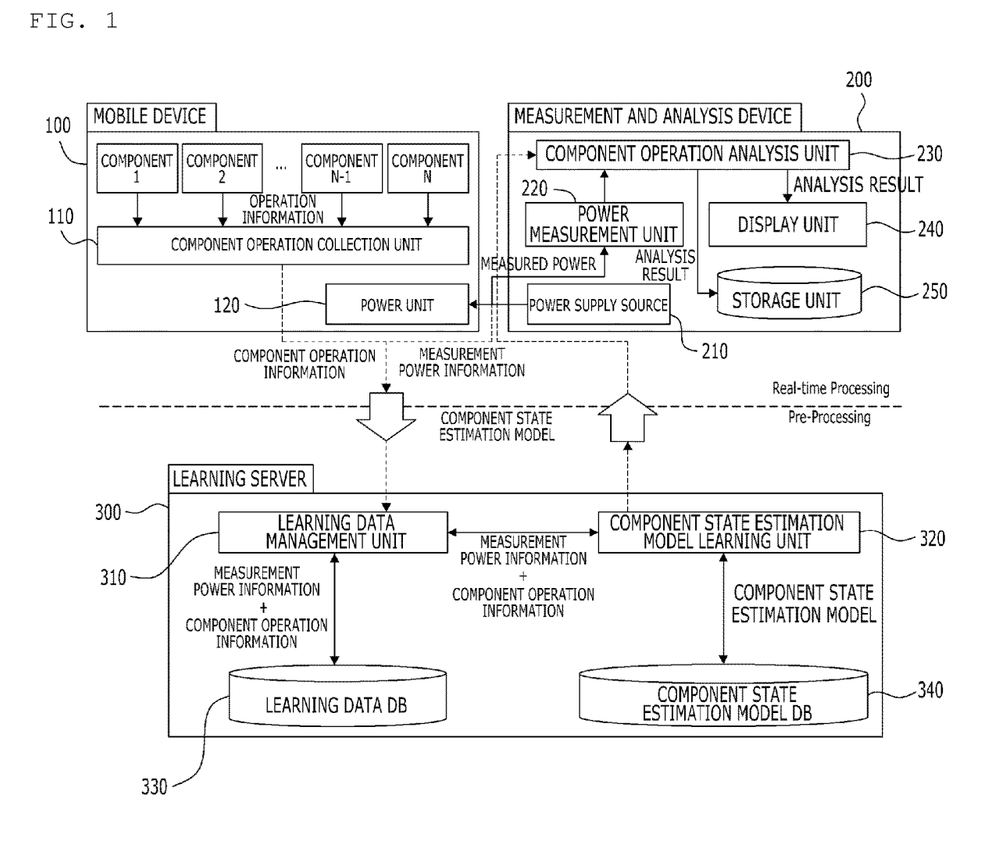
FIG. 1 is a diagram illustrating a power measurement and analysis system of a mobile device according to an embodiment of the present invention.
Figure 2:
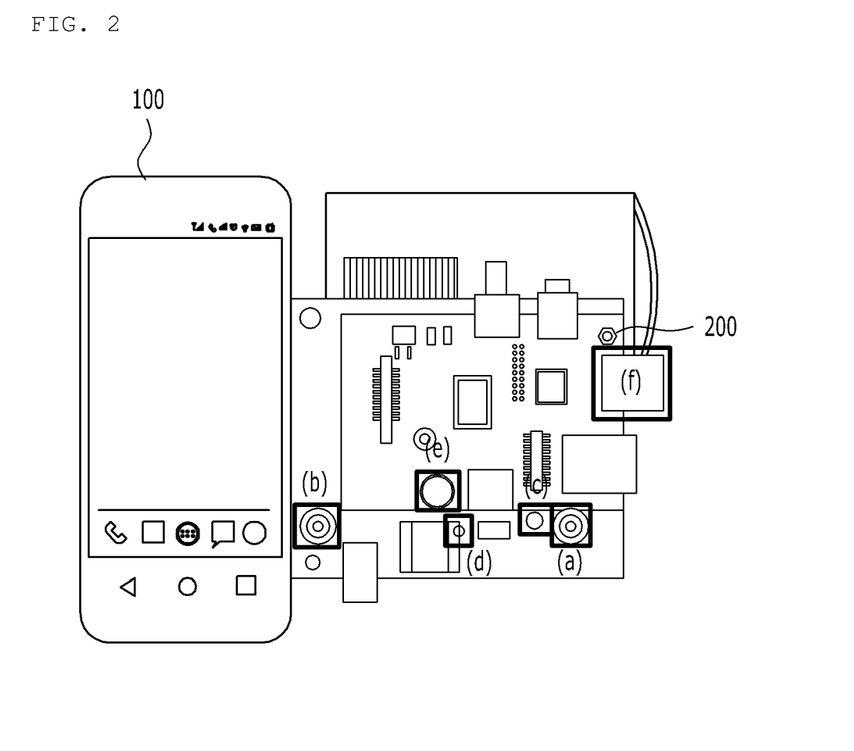
FIG. 2 is an exemplary diagram in which a mobile device and a measurement and analysis device according to an embodiment of the present invention are connected.
Figure 3:
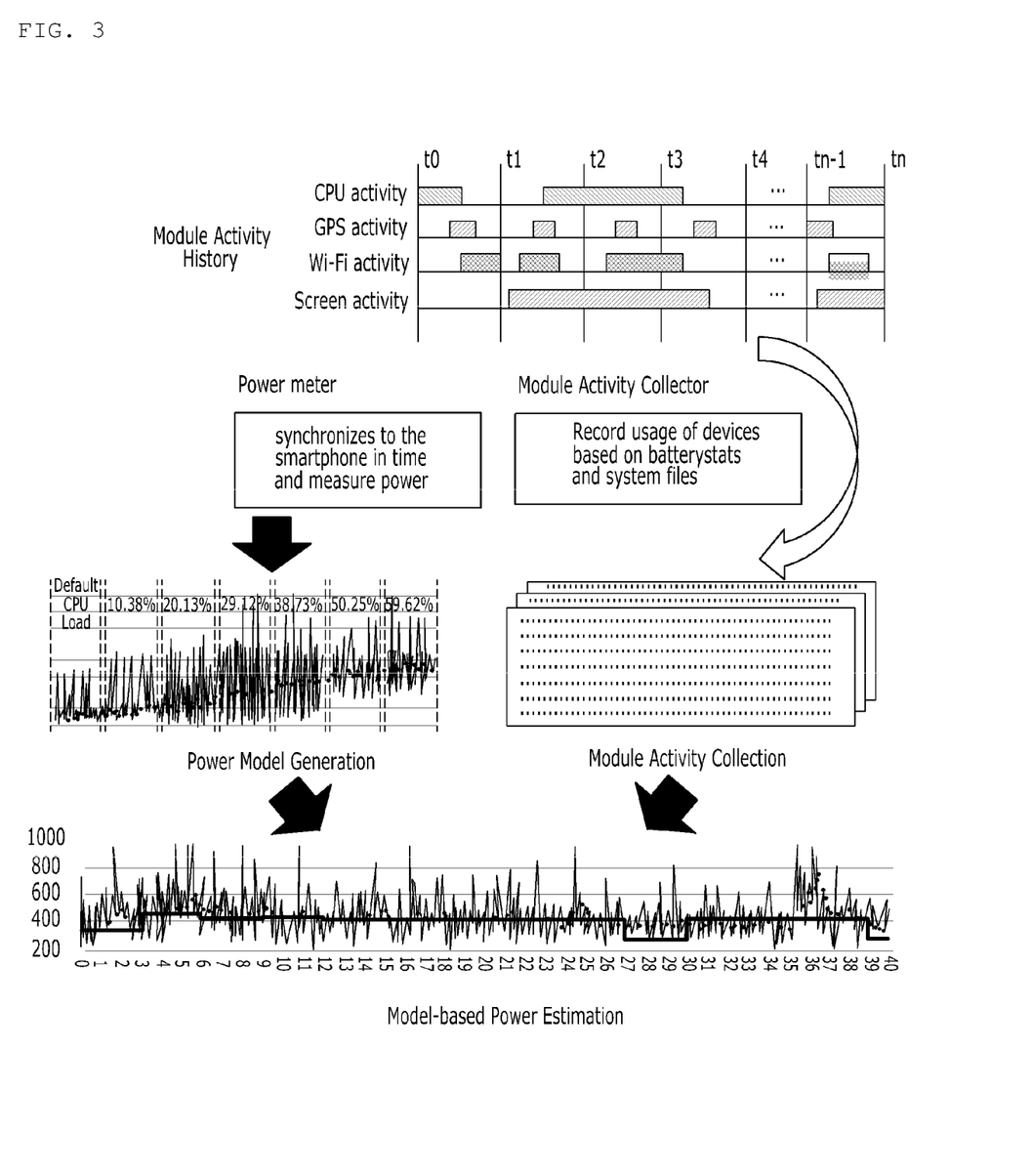
FIG. 3 is a diagram illustrating a process of estimating the power that has been consumed by a mobile device through a component operation collection unit and a power measurement unit according to an embodiment of the present invention.
Figure 4:
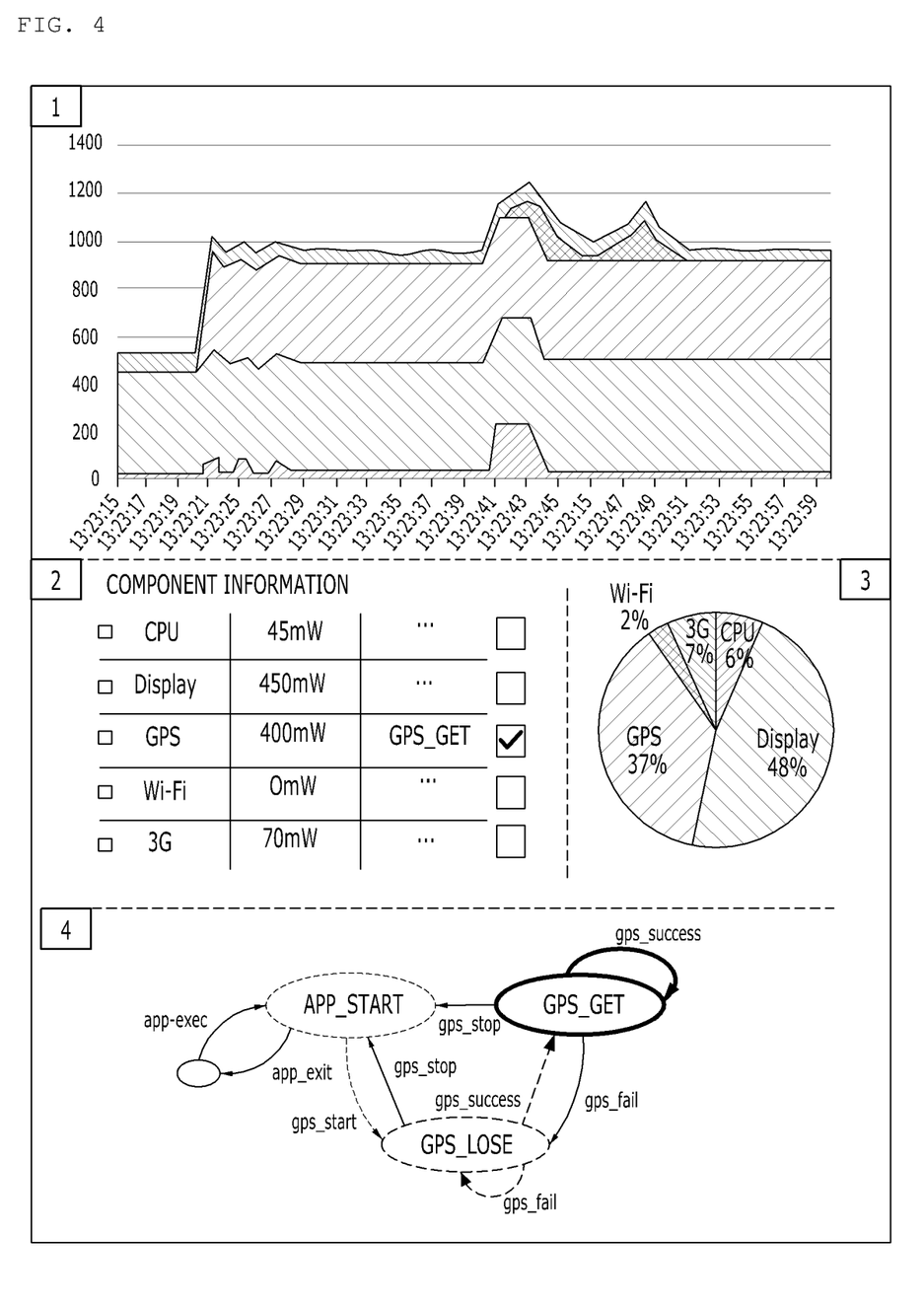
FIG. 4 is an exemplary diagram illustrating information of components that is output from the measurement and analysis device according to an embodiment of the present invention.
Figure 5:
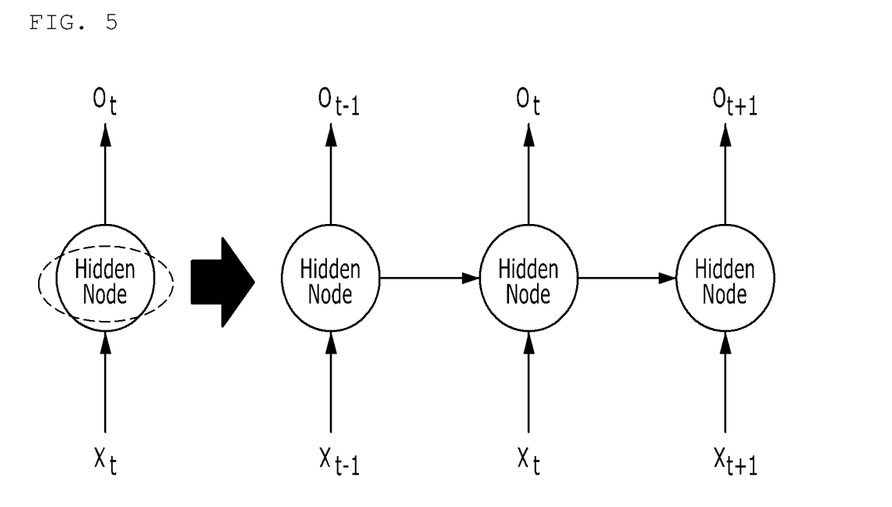
FIG. 5 is a diagram illustrating the structure of an RNN according to an embodiment of the present invention.
Figure 6:
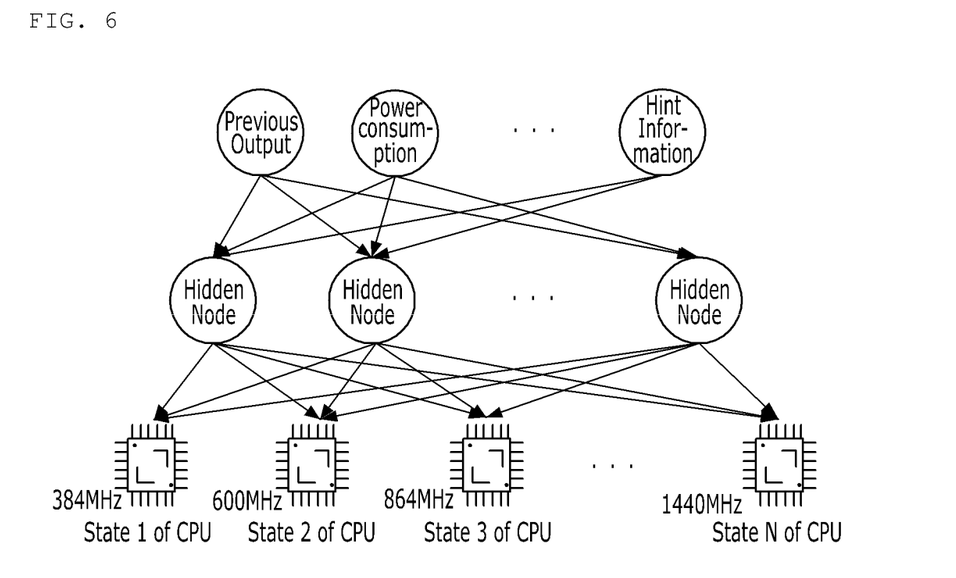
FIG. 6 is an exemplary diagram showing an input/output type of an RNN model under the assumption that a mobile device according to an embodiment of the present invention includes only a CPU.

FIG. 1 is a diagram illustrating a power measurement and analysis system of a mobile device according to an embodiment of the present invention, FIG. 2 is an exemplary diagram in which a mobile device and a measurement and analysis device according to an embodiment of the present invention are connected, FIG. 3 is a diagram illustrating a process of estimating the power that has been consumed by a mobile device through a component operation collection unit and a power measurement unit according to an embodiment of the present invention, FIG. 4 is an exemplary diagram illustrating information of components that is output from the measurement and analysis device according to an embodiment of the present invention, FIG. 5 is a diagram illustrating the structure of an RNN according to an embodiment of the present invention, and FIG. 6 is an exemplary diagram showing an input/output type of an RNN model under the assumption that a mobile device according to an embodiment of the present invention includes only a CPU.

Referring to FIG. 1, a power measurement and analysis system of a mobile device according to an embodiment of the present invention includes a mobile device 100, a measurement and analysis device 200, and a learning server 300.

The mobile device 100 collects operation information of components that are operated in accordance with execution of applications. The components, which are parts consuming power in the mobile device 100, mean modules designed to be independently installed, replaced, and used to provide fundamental functions of the mobile device 100 such as a CPU, Wi-Fi, an audio, a display (LCD, LED, etc.), a GPS, a cellular, and memory may further include an acceleration sensor, a luminance sensor, a magnetic field sensor, a pressure sensor, a proximity sensor, a temperature sensor, etc. that are sensors collecting signals related to senses such as light, sound, and temperature. The operation information, which is information about corresponding components that are operated in the mobile device in accordance with execution of applications, may include the model name of a component, execution time, CPU percentage utilization, and a communication-related state.

The mobile device 100 includes a component operation collection unit 110 that collects operation information of each of the components and a power unit 120 that is supplied with power from the measurement and analysis device 200.

The component operation collection unit 110 collects information related to the states of the components constituting the mobile device 100. The states of the components correspond to operations of the components in terms of power consumption based on the information of the components that can be acquired from an operating system. The components consume power in proportion to the time for which they stay in corresponding states, and the same states have the same power consumption amounts. For example, the power consumption amount may be the product of unit power consumption and usage time at specific screen brightness in a display; the product of unit power consumption and usage time for a phone call in a phone (call); the sum of the product of unit power consumption and a data transmission amount for data transmission and the product of unit power consumption and usage time for use of Bluetooth in Bluetooth; the sum of the product of unit power consumption and usage time for use of Wi-Fi, the product of unit power consumption and scan time for Wi-Fi scan, and the product of unit power consumption and a data transmission amount for data transmission in Wi-Fi; the product of unit power consumption and execution time of system codes and App codes at a specific clock speed of a CPU in the CPU; and the product of unit power consumption and usage time for GPS in the GPS.

Accordingly, the operation information (state information) of each of components that is required to estimate power consumption of the components may be screen brightness and screen usage time in a display, call time in a phone (call), a data transmission amount and Bluetooth usage time in Bluetooth, Wi-Fi usage time, scan time, and a data transmission amount in Wi-Fi, execution time of system codes, execution time of App codes, and a clock speed in a CPU, and GPS usage time in a GPS.

For example, a power model (regression model) in the specific mobile device 100 may be shown, as in Table. 1. Factors that influence power consumption of the components constituting the mobile device 100 are arranged in Table 1 and the entire power consumption of the mobile device 100 can be estimated from the factors.

TABLE 1

Model
$(\beta_{uh} \times \text{freq}_h + \beta_{ul} \times \text{freq}_l) \times \text{util} + \beta_{CPU} \times \text{CPU}_{on} + \beta_{br} \times \text{brightness} + \beta_{Gon} \times \text{GPS\_on} + \beta_{Gsl} \times \text{GPS\_sl} + \beta_{Wi\text{-}Fi\_l} \times \text{Wi-Fi}_l + \beta_{Wi\text{-}Fi\_h} \times \text{Wi-Fi}_h + \beta_{3G\_idle} \times 3G_{idle} + \beta_{3G\_FACH} \times 3G_{FACH} + \beta_{3G\_DCH} \times 3G_{DCH}$

| Category | System variable | Range | Power coefficient | Category | System variable | Range | Power coefficient |
|---|---|---|---|---|---|---|---|
| CPU | util | 1-100 | $\beta_{uh}$: 4.34<br>$\beta_{ul}$: 3.42 | LCD | Brightness | 0-255 | $\beta_{br}$: 2.40 |
|  |  |  |  | GPS | GPS_on | 0, 1 | $\beta_{Gon}$: 429.55 |
|  | freq$_l$, freq$_h$ | 0, 1 | n.a. |  | GPS_sl | 0, 1 | $\beta_{Gsl}$: 173.55 |
|  | CPU_on | 0, 1 | $\beta_{CPU}$: 121.46 | Cellular | Data_rate | 0-∞ | n.a. |
| Wi-Fi | Npackets, R$_{data}$ | 0-∞ | n.a. |  | Downlink_queue | 0-∞ | n.a. |
|  | R$_{channel}$ | 1-54 | $\beta_{cr}$ |  | Uplink_queue | 0-∞ | n.a. |
|  | Wi-Fi$_l$ | 0, 1 | $\beta_{Wi\text{-}Fi_l}$: 20 |  | 3G$_{idle}$ | 0, 1 | $\beta_{3G_{idle}}$: 10 |
|  | Wi-Fi$_h$ | 0, 1 | $\beta_{Wi\text{-}Fi_h}$: Equation 1 |  | 3G$_{FACH}$ | 0, 1 | $\beta_{3G_{FACH}}$: 401 |
| Audio | Audio_on | 0, 1 | $\beta_{audio}$: 384.62 |  | 3G$_{DCH}$ | 0, 1 | $\beta_{3G_{DCH}}$: 570 |

The component operation collection unit 110 can collect operation information of the components by using a system service (e.g., BatteryStats) that is fundamentally provided by an operating system, or changing the operating system of the device and adding a driver etc. When a system service fundamentally provided by an operating system is used, there is no additional calculation for collecting operation information of components, so a probe effect is not generated. However, a very large calculation is required to output collected operation information of components to the outside, so there is a limit in collecting operation information of components in real time. Further, when the component operation collection unit 110 is added, it is possible to acquire detailed operation information of components in comparison to the system service fundamentally provided by an operating system, so the accuracy of a component state estimation model learned from data obtained from the operation information may be high. However, this method has a problem with security and safety due to changes in an operating system, and has a defect that expandability and portability are deteriorated because it depends on the kinds and versions of an operating system and components. The information collected by the component operation collection unit 110 is transmitted to the learning server 300.

It is exemplified in the following description that the component operation collection unit 110 uses BatteryStats that is a system service provided by an operating system. BatteryStats is a command that can be used without a specific change in a system in Android and can be applied to various devices because it has no dependence on devices. Accordingly, it is possible to acquire information such as usage time of a display, a cellular, Wi-Fi, a GPS, etc.

Table 2 shows an example of components that can be found out through BatteryStats and information that can be obtained from each of the components.

TABLE 2

| Subcomponent/Application | Statistical Variable | Models |
|---|---|---|
| Screen | Time spent at brightness level i, $T_{bri-i}$ | $E_{Screen} = \Sigma_{i=1}^{N} (P_{brightness} \times T_{bri-i})$ |
| System Idle | The total duration $T_{total}$; time spent when screen is on, $T_{screenOn}$ | $E_{Idle} = P_{cpuIdle} \times (T_{total} - T_{screenOn})$ |
| Radio (Cell Standby) | Time spent when signal strength is i, $T_{str-i}$; total time spent in scanning, $T_{scan}$ | $E_{mobileStandby} = (\Sigma_{i=1}^{N} P_{strength} \times T_{str-i}) + P_{radioScan} \times T_{scan}$ |
| Phone (Call) | Duration of a call, i, $T_{call-i}$ | $E_{call} = \Sigma_{i=1}^{N} (P_{call} \times T_{call})$ |
| Bluetooth | $T_{bluetoothOn}$, Ping$_{count}$ | $E_{Bluetooth} = (P_{bluetoothOn} \times T_{bluetoothOn}) + (\text{Ping}_{count} \times P_{atCommand})$ |
| Wi-Fi$_{App}$ | Total duration an app, i, uses Wi-Fi, $T_{wifiApp-i}$; scan time for the app, $T_{wifiScan-i}$ | $E_{wifiApp} = T_{wifiApp-i} \times P_{wifiOn} + T_{wifiScan-i} \times P_{wifiScan}$ |
| Wi-Fi$_{noApps}$ | Total Wi-Fi usage time $T_{wifiGlobal}$; Wi-Fi usage time by an app, i, $T_{wifiApp-i}$ | $E_{wifinoApps} = (T_{wifiGlobal} - \Sigma_{i=1}^{N} T_{wifiApp-i}) \times P_{wifiOn}$ |
| CPU$_{App}$ | Time spent at speed, i, $T_{speed-i}$; time spent in executing app code, $T_{appCode}$; time spent to execute system code, $T_{sysCode}$ | $E_{cpuApp} = \sum_{i=1}^{N} \frac{T_{speed-i}}{\sum_{i=1}^{N} T_{speed-i}} \times (T_{appCode} + T_{sysCode}) \times P_{speed-i}$ |

TABLE 2-continued

| Subcomponent/Application | Statistical Variable | Models |
|---|---|---|
| Wakelock | Wakelock ime, $T_{wakeLock}$ | $E_{wakeLock} = (P_{wakeLock} \times T_{wakeLock})$ |
| GPS | GSP usage time, $T_{gps}$ | $E_{gps} = (T_{gps} \times P_{gps})$ |
| Mobile Data (Byte/Sec) | Radio active time, $T_{radioActive}$ | mobileBps = (mobileData × 1000/$T_{radioActive}$) |
| Wi-Fi Data (Byte/Sec) | Wi-Fi active time, $T_{wifiActive}$ | wifiBps = (wifiData × 1000/$T_{wifiActive}$) |
| Average Energy Cost per Byte | | $E_{byte} = \left(\dfrac{P_{wifiActive}}{wifiBps} \times wifiData + \dfrac{P_{radioActive}}{mobileBps} \times mobileData\right) / (wifiData + mobileData)$ |
| App | | $E_{App} = E_{cpuApp} + E_{wakeLock} + E_{wifiApp} + E_{gps} +$ (tcpBytesReceived + tcpBytesSent) × $E_{byte}$ |

The component operation collection unit 110 records percentage utilization of the mobile device 100 on the basis of information extracted to applications that can be installed in the mobile device 100. The percentage utilization means the degree of use of a device to sampling time and has different meanings, depending on the kinds of variables of the target device. In variables of a device, usage time of a screen, call time, Bluetooth usage time, Wi-Fi usage time, and GPS usage time mean time for which the device has operated for sampling time, and a data transmission amount in Bluetooth and a data transmission amount in Wi-Fi mean data transmission amounts for sampling time. Brightness of a screen means the brightness of the screen for sampling time, execution time of a CPU means time taken to execute system codes and user codes for sampling time.

The measurement and analysis device 200 measures the entire power consumption of the mobile device 100 by measuring the power amount that is supplied to the mobile device 100. That is, the measurement and analysis device 200 can supply external power to the mobile device 100 and can measure the entire power consumption of the mobile device 100 by measuring the power amount that is supplied to the mobile device 100. The entire power consumption of the mobile device 100 can be measured in two methods, depending on whether a battery is attached to the mobile device 100. As a first method, it is possible to measure power consumption of the mobile device 100 without separating a battery from the mobile device 100. In this case, the mobile device 100 uses a principle that shorts a circuit for charging the battery and operates the mobile device 100 using only power supplied from not the battery, but the outside when the battery is fully charged. Using this principle makes it possible to measure power consumption of the mobile device 100 even without separating the battery. This method does not need to separate a battery, so it can be easily applied to a battery-integrated mobile device; however, power can be accurately measured when the mobile device 100 has been fully charged, but power consumption cannot be accurately measured during charging. As a second method, it is possible to measure power consumption of the mobile device 100 by separating a battery terminal from the mobile device 100 and supplying power through the separated battery terminal. In this case, a state called a charging state does not exist, so measurement is possible anytime, but a battery terminal should be separated.

The measurement and analysis device 200 estimates component states by inputting the entire power consumption of the mobile device 100 to a component state estimation model and calculates and displays power consumption of each of the components on the basis of the estimated component states.

The measurement and analysis device 200 may have easy-to-setup, mobility, portability, resolution, accuracy, and real-time operability. The easy-to-setup means that a measurement environment should be easy to set up, the accuracy means that low resolution that is a defect of mobile equipment should be overcome, and the mobility means that measurement is possible during moving. That is, the operational situation of mobile devices is a moving state in many cases, so it is an important factor whether measurement is possible during moving. Accordingly, measurement should be possible even during moving, using a measurement method that does not need small-sized measuring tools, a mobile power source, and a PC. The portability means that measurement is possible for any types of mobile devices. The kinds and shapes of mobile devices are varied and different components may be used in different kinds of mobile devices, so it is difficult to estimate power consumption. Further, there are devices with a built-in battery in which a battery cannot be separated, of mobile devices that are recently released, so portability should be secured for all kinds. The accuracy means that there is a difference in precision, but the measured value should be accurate with development in measurement technology. The accuracy of the analysis device 200 means whether the actual usage amount of the mobile device 100 is accurately reflected, and an analysis method using an energy model shows different results, depending on whether an operation has been reflected to the model. The real-time operability means that it is possible to check a measured value simultaneously with measurement.

FIG. 2 shows estimating power of the mobile device 100 using the measurement and analysis device 200. Power is supplied to the measurement and analysis device 200 and the mobile device 100 from an external battery and the measurement and analysis device 200 measures the power supplied to the mobile device 100.

The measurement and analysis device 200 includes a power supply unit 210, a near-field communication unit (not shown), a power measurement unit 220, a component operation analysis unit 230, a display unit 240, and a storage unit 250.

The power supply unit 210 can supply power to the mobile device 100, in an external power supply type, and can measure the supplied power. It is possible to supply and measure power without separating a battery from the mobile device 100 and it may be possible to supply and measure power with a battery terminal separated.

The power supply unit 210 supplies stable power to the mobile device 100. The power supply unit 210 is the most important to enable measuring and analyzing power of the mobile device 100 during moving. If a power source is not portable, the power measurement and analysis device 200 loses mobility. Tools should be operated by a portable power source, and if a power source is fixed, measurement is not free, so it is required to deal with various power sources. For example, when power is supplied to a USB terminal of the mobile device 100 and the supplied power is measured, the limit on devices with a built-in battery is removed. Further, a precise resistor for a current sensor sized such that a loss of power due to resistance is reduced and a measured value is maintained within an effective range may be used. When power is supplied through the measurement and analysis device 200, it is possible to measure the power that is consumed by the mobile device 100 and to stably supply power like using an external assistant battery.

The near-field communication unit, which is a part performing wireless communication with the mobile device 100, for example, may be Bluetooth. The measurement and analysis device 200 transmits/receives control commands to/from the mobile device 100 through the near-field communication unit, thereby being able to control the mobile device 100 and the measurement and analysis device 200.

The power measurement unit 220 measures the entire power consumption of the mobile device 100 by measuring the power amount that is supplied to the mobile device 100. The power measured by the power measurement unit 220 is transmitted to the learning server 300 and used to create data for learning a component state estimation model, or is transmitted to the component operation analysis unit 230 and used for analysis. Power can be measured and calculated by connecting in series a precision resistor for a current sensor to a power source that supplies power to the mobile device 100 and then obtaining a current using a voltage difference between both ends of the resistor.

That is, the power measurement unit 220 uses a resistor for a current sensor and the voltage input from the resistor for a current sensor is a low voltage of mV or less. Accordingly, the power measurement unit 220 is designed to be able to amplify input voltage 200 times to have resolution of 1 mA level and can measure entire power consumption to conveniently analyze power use of the mobile device 100.

The component operation analysis unit 230 estimates the states of components using machine learning, which has the entire power consumption of the mobile device 100 as input to a component state estimation model, and estimates the power consumption of each of the components from the estimated states of the components in real time.

That is, the component operation analysis unit 230 estimates each state of the components using the entire power consumed by the mobile device 100, and then calculates the power consumption of each of the components from the estimated state information of the components. A regression model (power model) may be used to estimate the power consumption of the components using the state information of the components. As the regression model, a regression model of the operating system of mobile devices that are widely used may be reused or a new power consumption estimation model for each component may be used.

In detail, the component operation analysis unit 230 inputs the entire power consumption measured by the power measurement unit 220 to the component state estimation model and outputs the states of the components constituting the mobile device 100. The state information of the components is transmitted to the display unit 240 and shown to a user in real time or is used to estimate the power that is consumed by the components through a power model (regression model). Obviously, the estimated power consumption of each of the components is also transmitted to the display unit 240 and provided to a user in real time.

Meanwhile, synchronization is required so that the component operation analysis unit 230 analyzes power data measured by the power measurement unit 220 and the component operation information. To this end, the power measurement unit 220 is synchronized with the time of the mobile device 100 by transmitting initial measurement time of the mobile device 100 and then correcting system time on the basis of the initial measurement time. After measurement is started, power is measured and recorded together with the measurement time, thereby being able to analyze the state of a component according to the measurement time. In detail, the component operation collection unit 110 of the mobile device 100 records the percentage utilization of the device between previous sampling time and current sampling time on sampling time and records time for which sampling has occurred on the basis of the time of the mobile device 100. That is, the time synchronized for each record is recorded on a power measurement file and a component operation log file, so analysis is possible through comparison of time.

The power measurement and analysis device 200 includes a power supply toggle switch a, a mobile power supply switch b, a power supply confirmation LED c, a Bluetooth communication confirmation LED d, a reset switch e, a power supply USB f on a PCB substrate.

FIG. 3 is an exemplary diagram illustrating a process of estimating power consumed by the mobile device 100 through the component operation collection unit 110 and the power measurement unit 220. First, an environment limited to be able to find out power changes according to the percentage utilization of each of the components is constructed and power according to operations of the components is measured through the power measurement unit 220 and the component operation collection unit 110, thereby creating a power model. Thereafter, the component operation collection unit 110 can estimate power of each of the components by collecting percentage utilization according to operations of the components for executing an application and calculating power consumption according to the percentage utilization using the created power model. The power model is a model that is used to analyze power consumption of corresponding components when applications are executed, and it is possible to find out the power amounts that is consumed, on the basis of signals extracted from components for each application. For reference, the power model may be stored in advance in the measurement and analysis device to be used, or if it is not stored, a power model of the mobile device 100 that executes an analysis target application can be directly input from a developer to be used.

In detail, the component operation analysis unit 230 can calculate a real-time power consumption amounts on the basis of a power model showing a power consumption amount of each of the components executing an application and state information showing at least one operation state of each of the components. That is, the component operation analysis unit 230, for each of the components, can separately calculate power consumption amounts, in accordance with the operations that the components perform, when the components perform the operations, on the basis of the power model.

For example, it is assumed that a memory component is operated when a memo application is executed. When the current state corresponds to the case in which the memo application has only been initially started, it is possible to determine that the memory component is consuming 10 mW power as an initial state from the power model, and when the current state corresponds to the case in which a specific memo is being stored, it is possible to determine that the memory component is consuming 50 mW power from the power model.

Meanwhile, the component operation analysis unit 230 may calculate a real-time power consumption amounts further on the basis of state transition information showing changes until the current state that has selectively undergone at least one intermediate state from the initial state of each of the components. That is, the component operation analysis unit 230, for each of the components, can separately calculate power consumption amounts reflecting real-time changes of each operation in accordance with how the operations of the components change on the basis of the power model. For reference, the state transition information may show changes until the current state that has not undergone an intermediate state from the initial state or may show changes until the current state that has undergone at least one intermediate state from the initial state.

For example, it is assumed that a 3G module is operated when a phone call application is executed. When the current state corresponds to the case in which an application has been initially only executed, it is possible to determine that the 3G component is consuming 10 mW power as an initial state from the power model, when the current state corresponds to the case in which a phone call has been connected through a standby state for the phone call, it is possible to determine from the power model that the 3G component is consuming 300 mW power as the current state that has undergone an intermediate state, and when the current state corresponds to the case in which a phone call has been connected directly without a standby state for the phone call, it is possible to determine from the power model that the 3G component is consuming 100 mW power as the current state that has not undergone an intermediate state.

Accordingly, it can be seen that the power amounts that are consumed when the operation state of a component has changed into the current state from the initial state and when the operation state has changed into the current state from the initial state through at least one intermediate state are different from each other. For example, more power can be consumed when the operation state of a component has changed into the current change through at least one intermediate state than when the operation state has changed into the current state directly from the initial state. By even reflecting the state transition information, as described above, a developer can accurately analyze the power that is consumed by corresponding components in real time.

Therefore, according to an embodiment of the present invention, it is possible to calculate power consumption amounts by immediately reflecting not only the operation states of components corresponding to an application, which is being executed now, but also state changes about what states the components have had before the current states and what states the components have the current states through.

The analysis result by the component operation analysis unit 230 is stored in the storage unit 250 in the measurement and analysis device, or is transmitted to the display unit 240 and provided to a user.

The display unit 240 displays the entire power consumption of the mobile device 100 measured by the power measurement unit 220 and the state information and power consumption of each of the components that are the analysis results by the component operation analysis unit 230. The display unit 240 can visualize power consumption amounts in a graph (a stacking type broken-line graph and a pie graph) to intuitively provide them. Further, as long as a user of the system inputs a model that can be visualized, such as an FSM, to fit to the kind of the mobile device to be analyzed, the display unit 240 can visualize and provide the model.

The display unit 240 displays the entire power consumption amount and information of the components (the states or power consumption of the components) from the component operation analysis unit 230 in real time to a user of the measurement and analysis device 200. For example, the entire power consumption amount and the information can be visualized and provided, as shown in FIG. 4, for intuitional understanding of a user. It is possible to set desirable components to check of the components constituting the mobile device 100 so that only desirable components to analyze can be checked.

Referring to FIG. 4, the display unit 240 can display component power consumption for each time, as in 1. The power consumption of each component according to time is visualized using a stacking graph. Accordingly, it is possible to intuitively see the current entire power consumption of the mobile device 100 and the components related to the entire power consumption. Further, the display unit 240 can provide numerical values, as in 2, to provide the accurate numerical values of the power that the components consume. Further, the display unit 240 can display the power consumption ratio of each component, as in 3. Accumulated values of power consumed from the start point of measurement by the measurement and analysis device 200 to the present time are visualized using a pie graph. Accordingly, it is possible to intuitively discriminate the component that consumes the most power and the component that consumes the least power. Further, the display unit 240 can display component states, as in 2 and 4. The states of the components constituting the mobile device 100 are provided, as in the table in 2. If a user of the system inputs a model that can be visualized, such as an FSM (Finite State Machine), to fit to the kind of the mobile device 100 to analyze, a corresponding unit can visualize and provide the model. A power model that can be expressed by visualizing a model, which can be visually expressed such as an FSM, together with a regression model can be expressed, as in 4, and when a user selects a desirable component to visualize, as in 2, a power model corresponding to the selected component is visualized, as in 4.

The measurement and analysis device 200 having the configuration described above is designed to be able to perform measurement without depending on the mobile device 100, and can be carried.

Further, the measurement and analysis device 200 is implemented in an external power supply type, can use Raspberry-Pi that is a one board computer, and can use a way of driving programs on an OS installed in Raspberry-Pi. Expansion using an OS is easy, but the load applied to a system to maintain the OS is not negligible, so relatively light Arch linux can be used. A shunt resistor is used to measure a current, using the magnitude of resistor and voltage applied to the resistor.

The learning server 300 learns a component state estimation model using the operation information of the components collected from the mobile device 100 and the entire power consumption measured by the measurement and analysis device 200, and transmits a component state estimation model to the measurement and analysis device 200.

The learning server 300 includes a learning data management unit 310 and a component state estimation model learning unit 320. The learning server 300 may further include a learning data DB 330 that stores learning data created by the learning data management unit 310 and a component state estimation model DB 340 that stores a component state estimation model created by the component state estimation model learning unit 320. The learning data DB 330 and the component state estimation model DB 340 are separately configured here, but they may be configured in one database.

The learning data management unit 310 creates learning data using the operation information of the components collected by the component operation collection unit 110 of the mobile device 100 and the power consumption amount measured by the power measurement unit 220 of the measurement and analysis device 200. That is, the learning data management unit 310 creates one data set (input data and corresponding output data) by matching component operations at the same time with the entire power consumed by the mobile device 100. The created data set may be the learning data. Accordingly, the learning data is composed of input data and corresponding output data and is created by matching the component operation information collected by the component operation collection unit 110 with the power consumption measured by the power measurement unit 220 on the basis of time. The input data may be composed of the entire power consumption of the mobile device 100 within predetermined time and information that can be referred to for easy analysis of the states of the components and the power consumption of each of the components through the power. The information for easy analysis of the component states and the power consumption of each of the components may be the sensing period of sensors that are in operation now, the UID (the name) of an application that is being executed, and the operation order of the components. The output data may be the states of the components.

The learning data management unit 310 stores and manages the created learning data in the learning data DB 330 and provides the learning data to be used to learn the component state estimation model by the component state estimation model learning unit 320. The states of the components constituting the mobile device 100 is not indicated by labels such as 1, 2, and 3, but each of the states of the components is expressed as one class, and the number of the states of the components constituting the mobile device 100 is the number of total classes. The states are nominal data and each has one name without order. Further, the states cannot be expressed by ordinal data having order among data such as 1, 2, and 3. Data 2 between 1 and 3 in ordinal data has a meaning that is the middle of 1 and 3, but the states are nominal data, and when they are given labels such as 1, 2, and 3, the state 2 does not have a meaning that is the middle of the state 1 and the state 3, so they cannot be expressed by labels.

When a component belongs to a state, the class expressing the state has a value of 1 and the other classes have a value of 0. For example, a Wi-Fi component may have a total of three kinds of states (Default, Data Transmission, and Wi-Fi scan). The three states are classes and the current state of the Wi-Fi component would be one of the three states, so one of the three classes can have 1.

The component state estimation model learning unit 320 learns a component state estimation model for analyzing (estimating) the states of the components through the entire power consumption of the mobile device 100. The component state estimation model learning unit 320 makes the component state estimation model be learned using the learning data created by the learning data management unit 310.

In detail, the component state estimation model learning unit 320 estimates state information of the components through the component state estimation model, estimates power consumption of corresponding components according to the estimated component state information using a power model showing the power consumption amounts of the components, compares a difference between the entire power consumption of the mobile device, which is the sum of the estimated power consumption of the components, and the actually measured entire power consumption of the mobile device with a predetermined critical value, finishes learning the component state estimation model when the difference is smaller than the critical value, and learns the component state estimation model by repeating the same process using new learning data when the difference is not smaller than the critical value. The component state estimation model outputs the states of the components constituting the mobile device 100 with the entire power that is consumed by the mobile device 100 using an algorithm such as machine learning.

For example, the algorithm may be an RNN that can perform sequential data pattern learning to reflect power consumption and component state changes according to time. The RNN (Recurrent Neural Network) is an algorithm for learning data that changes as time passes, in which a reference point of time and the next point of time are connected, so a past value influences calculation of a current value.

FIG. 5 shows a general structure of an RNN, in which predetermined input is given and comes out as output through hidden nodes reflecting a past value. When the RNN is applied to the present invention, the previous states of components that are previous output, the entire power that is currently consumed of the mobile device 100, and information for easy analysis of the states of components are given as input, the information passes through hidden nodes, and the states of the components are output.

FIG. 6 shows an input/output process in an RNN model under the assumption that the mobile device 100 includes only a CPU. The CUP is composed of N states and the states are classes. The classes each have a probability value between 0 and 1 and the class having the largest probability value is recognized as the current state of the CPU. A component state estimation model finishes being learned when the difference between a power amount estimated through a power model (regression model) using state information of components obtained through the component state estimation model and the entire power consumption of the mobile device 100 of input data is less than a predetermined critical value, and if not, it is leaned by repeating the same process using new learning data. The model that finishes being learned is stored in the component state estimation model DB 340, and is provided to the measurement and analysis device 200 when there is a request later from the measurement and analysis device 200.

Meanwhile, although the mobile device 100 including the component operation collection unit 110, the measurement and analysis device 200 including the power measurement unit 220 and the component operation analysis unit 230, and the learning server 300 including the component state estimation model learning unit 320 are implemented as separate devices, the component operation collection unit 110, the power measurement unit 220, the component operation analysis unit 230, and the component state estimation model learning unit 320 may be implemented in a single device.

Figure 7:
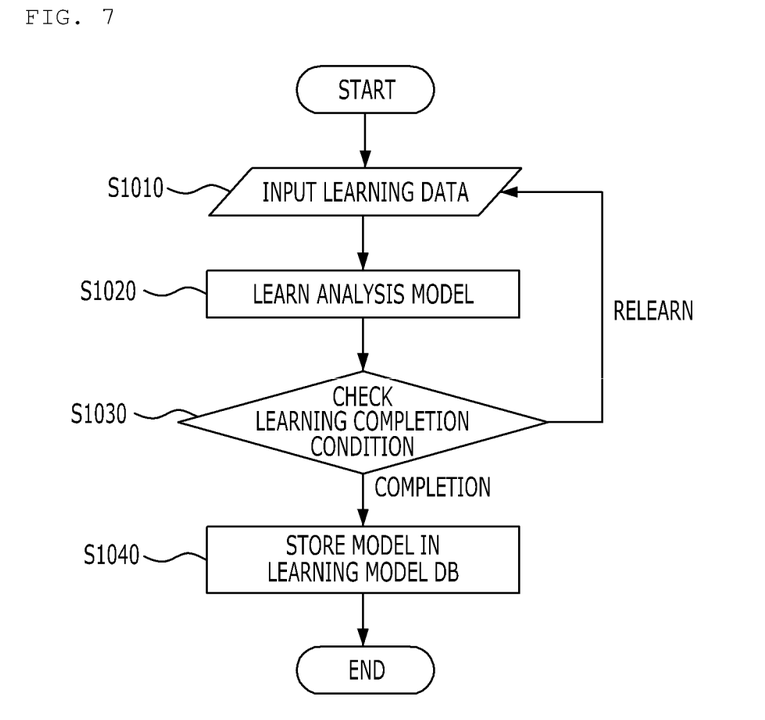
FIG. 7 is a flowchart illustrating a method of learning a component state estimation model according to an embodiment of the present invention.

FIG. 7 is a flowchart illustrating a method of learning a component state estimation model according to an embodiment of the present invention.

Referring to FIG. 7, when learning data is input (S1010), learning data makes a component state estimation model using the learning data be learned (S1020). The learning server can make the component state estimation model be learned using an algorithm such as machine learning.

Thereafter, the learning server determines whether to finish learning by comparing the difference between the entire power consumption of a mobile device estimated using state information of components obtained through the component state estimation model and the actually measured entire power consumption of the mobile device with a predetermined critical value (S1030). That is, the learning server estimates state information of components through the component state estimation model and estimates power consumption of corresponding components according to the estimated component state information using a power model (regression model) showing power consumption amounts of components. Thereafter, the learning server compares a difference between the entire power consumption of the mobile device that is the sum of the estimated power consumption of the components and the actually measured entire power consumption of the mobile device with a predetermined critical value, and then can finish learning the component state estimation model when the difference is smaller than the critical value.

When the difference between the two items of power consumption is smaller than the critical value as the result of determination in step S1030, learning the component state estimation model is finished (S1040), and when it is not smaller than the critical value, the same process is repeated using new learning data.

Preferred embodiments of the present invention were described. It would be understood by those skilled in the art that the present invention may be modified with departing from the scope of the present invention. Therefore, the disclosed embodiments should be considered in terms of explaining, not limiting. The scope of the present invention is not shown in the above description, but claims, and all differences within an equivalent range should be construed as being included in the present invention.

What is claimed is:

1. A power measurement and analysis system of a mobile device, the system comprising:
 a mobile device collecting operation information of components operating in accordance with execution of an application;
 a measurement and analysis device supplying power to the mobile device and measuring the entire power consumption amount of the mobile device by measuring an amount of the power that is supplied; and
 a learning server receiving the operation information of the components from the mobile device and the entire power consumption amount from the measurement and analysis device, learning a component state estimation model using the operation information of the components and the entire power consumption amount, and providing the learned component state estimation model to the measurement and analysis device,
 wherein the measurement and analysis device estimates states of the components by inputting the entire power consumption amount of the mobile device to the component state estimation model, and calculates power consumption of each of the components in real time through the estimated states of the components,
 wherein the measurement and analysis device includes:
 a power supply unit supplying the power to the mobile device;
 a power measurement unit measuring the entire power consumption amount of the mobile device by measuring the amount of the power supplied from the power supply unit; and
 a component operation analysis unit estimating the states of the components using machine learning having the entire power consumption amount of the mobile device as input to the component state estimation model, and estimating power consumption of each of the components in real time through the estimated states of the components,
 wherein the power measurement unit synchronizes time with the mobile device, measures power consumption of the mobile device after measurement is started, and records the measured power consumption with synchronized measurement time, and
 wherein the component operation analysis unit estimates the states of the components according to the measurement time and estimates in real time power consumption of the corresponding components according to the states of the components using a power model showing a power consumption amount of each of the components.

2. The power measurement and analysis system of claim 1, further comprising a display unit displaying the entire power consumption amount of the mobile device measured by the power measurement unit, and state information and power consumption of each of the components that are the analysis result by the component operation analysis unit.

3. The power measurement and analysis system of claim 1, further comprising a near-field communication unit performing wireless communication with the mobile device.

4. A power measurement and analysis method of a mobile device, the method comprising:
 collecting operation information of components operating in accordance with execution of an application, by means of a mobile device;
 measuring the entire power consumption amount of the mobile device by measuring an amount of a power that is supplied to the mobile device, by means of a measurement and analysis device;
 receiving the operation information of the components from the mobile device and the entire power consumption amount from the measurement and analysis device, learning a component state estimation model using the operation information of the components and the entire power consumption amount, and providing the learned component state estimation model to the measurement and analysis device, by means of a learning server; and
 estimating states of components by inputting the entire power consumption amount of the mobile device to the component state estimation model, and calculating power consumption of each of the components in real time through the estimated states of the components, by means of the measurement and analysis device,
 wherein the method comprises:
 supplying, by the measurement and analysis device, the power to the mobile device;
 measuring, by the measurement and analysis device, the entire power consumption amount of the mobile device by measuring the amount of the power supplied from the power supply unit; and estimating, by the measurement and analysis device, the states of the components using machine learning having the entire power consumption amount of the mobile device as input to the component state estimation model, and estimating, by the measurement and analysis device, power consumption of each of the components in real time through the estimated states of the components, wherein the method comprises synchronizing, by the measurement and analysis device, time with the mobile device, measuring, by the measurement and analysis device, power consumption of the mobile device after measurement is started, and recording, by the measurement and analysis device, the measured power consumption with synchronized measurement time, and wherein the method comprises estimating, by the measurement and analysis device, the states of the components according to the measurement time and estimating, by the measurement and analysis device, in real time power consumption of the corresponding components according to the states of the components using a power model showing a power consumption amount of each of the components by the measurement and analysis device.

* * * * *